(12) United States Patent
Chang et al.

(10) Patent No.: US 11,921,164 B2
(45) Date of Patent: Mar. 5, 2024

(54) INTELLIGENT BATTERY POWER DISCHARGE MANAGEMENT

(71) Applicant: DELL PRODUCTS, LP, Round Rock, TX (US)

(72) Inventors: Wen-Yung Chang, Taoyuan (TW); Chin-Jui Liu, Taoyuan (TW); Chien-Hao Chiu, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 13 days.

(21) Appl. No.: 17/349,146

(22) Filed: Jun. 16, 2021

(65) Prior Publication Data
US 2022/0404423 A1     Dec. 22, 2022

(51) Int. Cl.
*G01R 31/38*     (2006.01)
*G01R 31/3842*     (2019.01)
*H01M 10/42*     (2006.01)

(52) U.S. Cl.
CPC ...... *G01R 31/3842* (2019.01); *H01M 10/425* (2013.01); *H01M 2010/4271* (2013.01)

(58) Field of Classification Search
CPC ............ G01R 31/3842; H01M 10/425; H01M 2010/4271
See application file for complete search history.

(56) References Cited

U.S. PATENT DOCUMENTS

| | | | |
|---|---|---|---|
| 10,347,952 B2 | 7/2019 | Choi et al. | |
| 10,862,317 B2 | 12/2020 | Loncarevic | |
| 2014/0281618 A1* | 9/2014 | Sultenfuss | G06F 1/3212 713/323 |
| 2015/0067362 A1* | 3/2015 | Sultenfuss | G06F 1/26 713/320 |
| 2017/0294810 A1* | 10/2017 | Meng | H02J 50/80 |
| 2019/0006871 A1* | 1/2019 | Barsukov | H02J 7/0077 |
| 2020/0133361 A1* | 4/2020 | Jenne | G06F 1/263 |
| 2022/0166242 A1* | 5/2022 | Nielsen | H02J 7/00712 |

* cited by examiner

*Primary Examiner* — Catherine T. Rastovski
*Assistant Examiner* — Lal C Mang
(74) *Attorney, Agent, or Firm* — Larson Newman, LLP

(57) ABSTRACT

A battery pack for an information handling system includes a battery cell configured to provide current to the information handling system, and a battery management unit including an output to the information handling system. The output provides a maximum continuous current (MCC) indication and a peak power (PP) indication. The battery management unit determines an amount of current that the battery cell provides to the information handling system and determines an optimum MCC value that the battery cell can provide to the information handling system. The battery management unit further provides a first value on the PP indication, the first value being greater than the optimum MCC value, sums the amount of current provided to the information handling system that is in excess of the optimum MCC value, determines that the sum is greater than a threshold, and provides a second value on the PP indication, the second value being less than the optimum MCC value.

20 Claims, 4 Drawing Sheets

INTELLIGENT BATTERY POWER DISCHARGE MANAGEMENT

FIELD OF THE DISCLOSURE

This disclosure generally relates information handling systems, and more particularly relates to an intelligent battery power discharge management in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A battery pack for an information handling system may include a battery cell configured to provide current to the information handling system, and a battery management unit including an output to the information handling system. The output may provide a maximum continuous current (MCC) indication and a peak power (PP) indication. The battery management unit may determine an amount of current that the battery cell provides to the information handling system and determines an optimum MCC value that the battery cell can provide to the information handling system. The battery management unit may further provide a first value on the PP indication, the first value being greater than the optimum MCC value, sum the amount of current provided to the information handling system that is in excess of the optimum MCC value, determine that the sum is greater than a threshold, and provide a second value on the PP indication. The second value may be less than the optimum MCC value.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
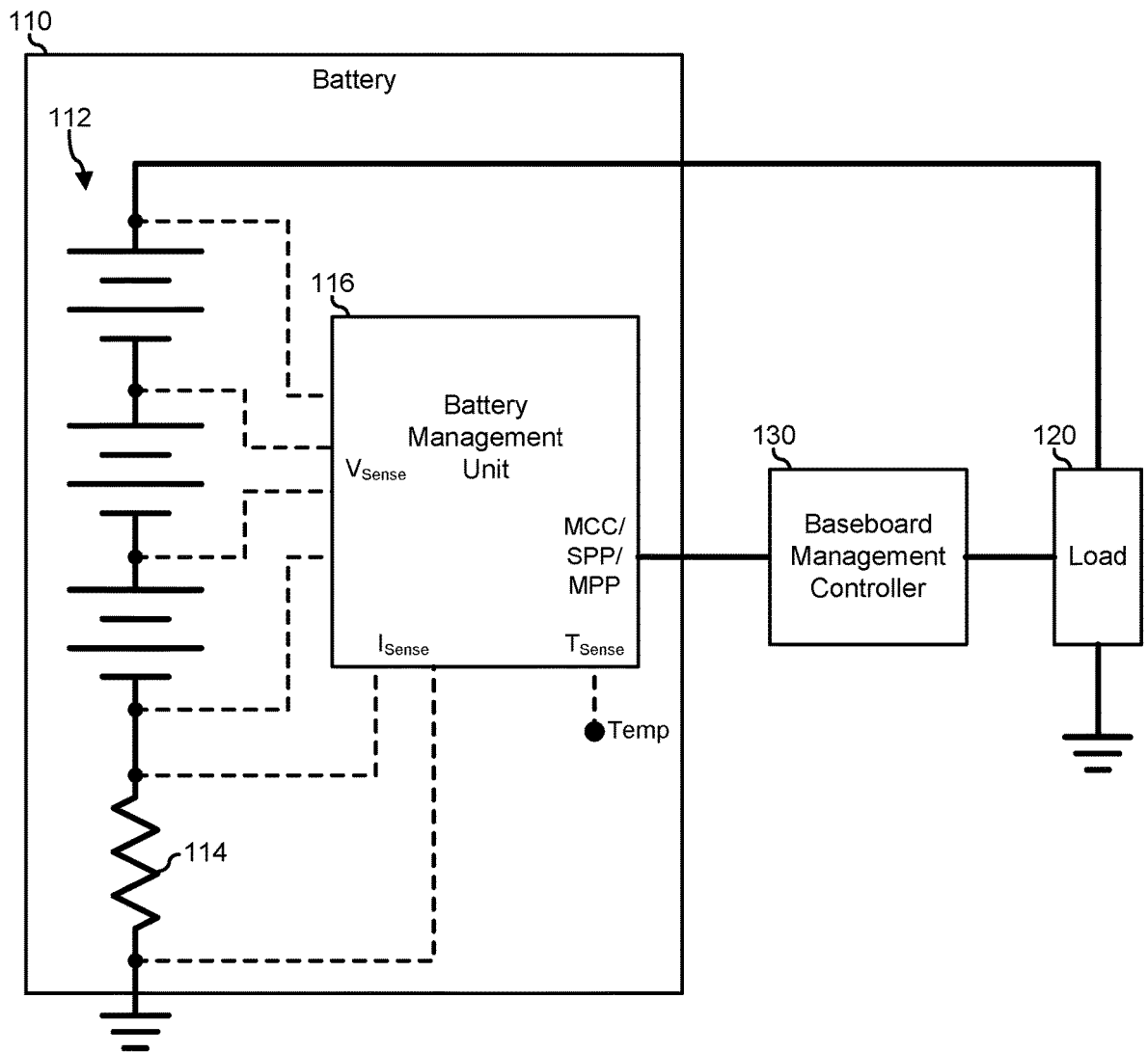
FIG. 1 is a block diagram of an information handling system according to an embodiment of the current disclosure.
Figure 1:
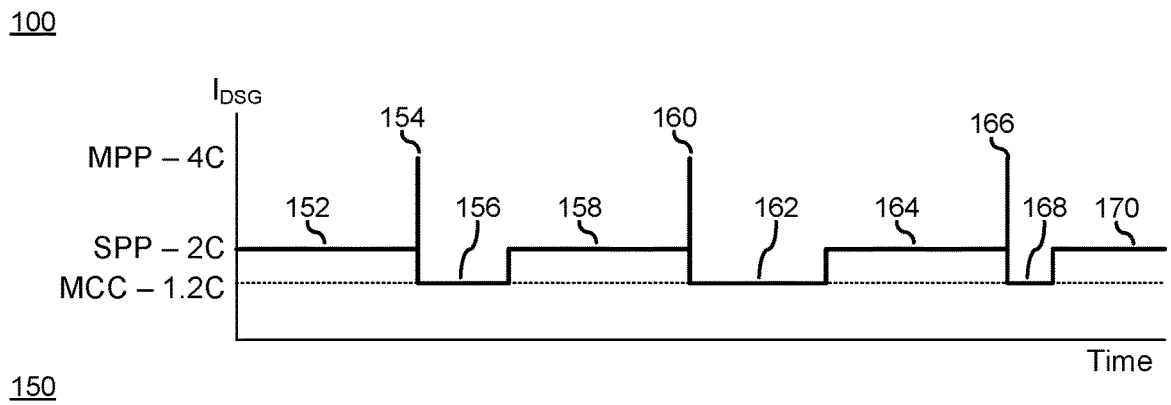

FIG. 1 illustrates an information handling system 100 including a battery pack 110, a load 120, and a baseboard management controller 130. Information handling system 100 represents a computer system, such as a laptop computer system, a tablet device, a cellular telephone device, or the like, that operates in a battery powered mode, with power to operate the information handling system being provided by battery pack 110. It will be understood that information handling system 100 may operate in other power modes, such as where the information handling system is plugged into a power adapter, or is collocated with a wireless charging station, or the like. However, for the purposes of the current disclosure, information handling system 100 will be understood to be powered such that the current drawn by load 120 is being provided by battery pack 110.

Battery pack 110 includes one or more battery cell 112, a current sense resistor 114, and a battery management unit (BMU) 116. Battery cell 112 represents a lithium ion (Li-ion) battery cell, a nickel cadmium (NiCad) battery cell, a nickel-metal hydride (NiMH) battery cell, or any other type of battery cell of any particular battery cell technology as needed or desired, and is typically configured to be a rechargeable battery cell. Battery cell 112 provides power to load 120 through current sense resistor 114. While battery cell 112 is depicted as being connected directly to load 120, this is not necessarily so, and battery pack 110 may include various power conditioning circuits, such as a buck/boost converter, current limiters, over-voltage and over-current protection devices, or other circuits situated between the battery cell and the load, as needed or desired. Further, battery cell 112 is depicted as including three (3) individual cells, but this is not necessarily so, and battery cell 112 one (1), two (2), or another number of individual cells as needed or desired. Moreover, while current sense resistor 114 is depicted as a resistor, this is not necessarily so, and other circuit elements may be utilized for sensing the current provided by battery pack 110 to load 120 as needed or desired.

BMU 116 represents logic configured to manage and maintain the operation of battery pack 110 in a safe, reliable, and long-lasting condition. In particular, BMU 116 operates to monitor the voltage on battery cell 112, the current detected across current sense resistor 114, and the temperature of battery pack 110, and to provide an indication of a maximum continuous current (MCC) that can be safely, and reliably provided by the battery pack for a suitably long duration without needing to be recharged, while also maintaining a suitably long battery life for the battery pack. Here, it will be understood that a battery pack such as battery pack 110 may be characterized by a battery "C" rating that indicates an amount of current at which the battery may be safely charged or discharged. Thus, where the capacity of a battery pack is provided as, for example, 10 Amp hours (Ah), the fully charged battery pack will be expected to provide a 1 C current of 10 Amps for one (1) hour, a 2 C current of 20 amps for a half an hour, a 4 C current of 40 amps for a quarter of an hour, etc.

BMU 116 factors in the current operating conditions of battery pack 110, such as the voltage on battery cell 112, the current provided to load 120 as detected with current sense resistor 114, and the temperature of the battery pack to calculate the MCC. Here, under normal operating conditions and when battery pack 110 is operating at a nominal temperature (e.g., below 50 C), a typical battery pack may provide an indicated MCC at or around 1.2 C in order to maximize battery life, battery longevity, and system performance. Further, when battery pack 110 is operating at a hotter temperature (e.g., above 50 C), a typical battery pack may provide an indicated MCC at or around 1.0 C in order to maximize battery life, battery longevity, and system performance. The actual MCC indicated by a particular battery pack may vary from this value due to the specific design of the battery pack, the operating conditions of the battery pack, or the like. However, for the purposes of illustration, the MCC for battery pack 110 will be assumed to be 1.2 C for normal operation unless otherwise defined herein. That is, it will be assumed that an indicated MCC of 1.2 C will provide a desired battery life, battery longevity, and system performance.

Battery pack 110 may be configured to operate in conformance with various enhanced performance guidance specified for loading the battery pack at a higher current levels than the indicated MCC value, in order to achieve greater performance for the information handling system. An example of enhanced performance guidance may include Intel Dynamic Battery Power Technology, or other processor manufacturers' guidance, as needed or desired. Here, BMU 116 may operate to provide turbo power reporting that includes a Sustained Peak Power (SPP) indication and a Maximum Peak Power (MPP) indication. In this way, load 120 may draw current from battery pack 110 at a higher (SPP) current level than the indicated MCC value (e.g., 2 C) in order to increase the performance of information handling system 100, but providing such a current that may be expected to result in a shorter battery life. Further, load 120 may draw current from battery pack 110 at an even higher (MPP) current level than the indicated MCC value (e.g., 4 C), but such higher currents may not be safely or reliably sustained for long durations of time because such sustained operation results in unsafe increases in operating temperatures and build up of gas resulting in swelling of the battery pack and decreased longevity for the battery pack. Further, any periods during which battery pack 110 provides operating currents at such higher current levels than the indicated MCC value (e.g., 2 C or 4 C) will typically be followed by resting periods during which BMU 116 decreases the indicated MCC value to allow the battery pack can cool off and de-gas to reduce the risk of swelling and maintain a long life.

The functions and features of battery management units and battery packs are known in the art and will not be further described herein, except as needed to illustrate the current embodiments. FIG. 1 further illustrates an enhanced performance guidance 150 where BMU 116 provides a varying indicated MCC value ($I_{DSG}$) over time. BMC 130 operates to receive the MCC, SPP, and MCC indications from BMU 116 and to condition the operation of load 120 based upon the indications. BMU 116 may provide the MCC, SPP, and MPP indications to BMC 130 via a SMBus interface or another interface, as needed or desired.

Enhanced performance guidance 150 provides for a relatively long duration (e.g., 10 seconds) of sustained high-performance window 152 with the loading being capped at a 2 C indicated SPP value, followed by a short duration (e.g., 10 ms) peak-performance spike 154 with the loading being capped at a 4 C indicated MPP value, before returning to a relaxed-performance window 156 with the loading being capped at a 1.2 C indicated MCC value. After relaxed-performance window 156 has elapsed, the cycle may repeat with a new sustained high-performance window 158 with an SPP value of 2 C, and a new peak-performance spike 160 with an MPP value of 4 C, before again returning to a relaxed-performance window 162. Again, after relaxed-performance window 162 has elapsed, the cycle repeats with a new sustained high-performance window 164 and a new peak-performance spike 166 before again returning to a relaxed-performance window 168. Finally, relaxed-performance window 168 is followed by a new sustained high-performance window 170, and so on.

The durations of relaxed-performance windows 156, 162, and 168 are not of equal duration because enhanced performance guidance 150 does not provide a minimum duration for the relaxed-performance window, but merely specify the behavior expected and the durations defined for the enhanced performance (i.e., the high-performance (SPP) and peak-performance (MPP) windows). That is, when the enhanced performance mode is called for, battery back 110 provides the depicted high-performance (SPP) windows 152, 158, 164, and 170, and the depicted peak-performance spikes (MPP) 154, 160, and 166, but enhanced performance guidance 150 does not typically specify how often the enhanced performance mode can be called or how long to remain in the relaxed-performance window.

The currents depicted in enhanced performance guidance 150 are not necessarily the amount of current actually drawn by load 120, but are maximum current limits. Therefore it is assumed by the issuer of enhanced performance guidance 150 that the durations of relaxed-performance windows 156, 162, and 168 will be of sufficient duration as to permit battery pack 110 to relax so as to not overstress the battery pack. An example of an enhanced performance guidance may include the Intel Turbo Power mode that provides for a high-performance window duration of ten (10) seconds, followed by a peak-performance spike of ten (10) milliseconds. The durations and current levels of the high-performance windows and peak-performance windows, as illustrated, will be understood to be exemplary durations and current levels, and it will be understood that other enhanced performance guidance may call for different durations and current levels, as needed or desired.

It has been understood by the inventors of the current disclosure that the demand for higher performance levels from information handling systems such as information handling system 100 has resulted in more frequent demands for the use of the enhanced performance guidance, and consequently to the decreased duration of the intervening relaxed-performance windows. As a result of this, manufacturers of information handling systems are seeing increasing stress on battery packs, resulting in swelling and decreased service life of the battery packs, and ultimately to decreased user satisfaction with the information handling systems.

Figure 2:
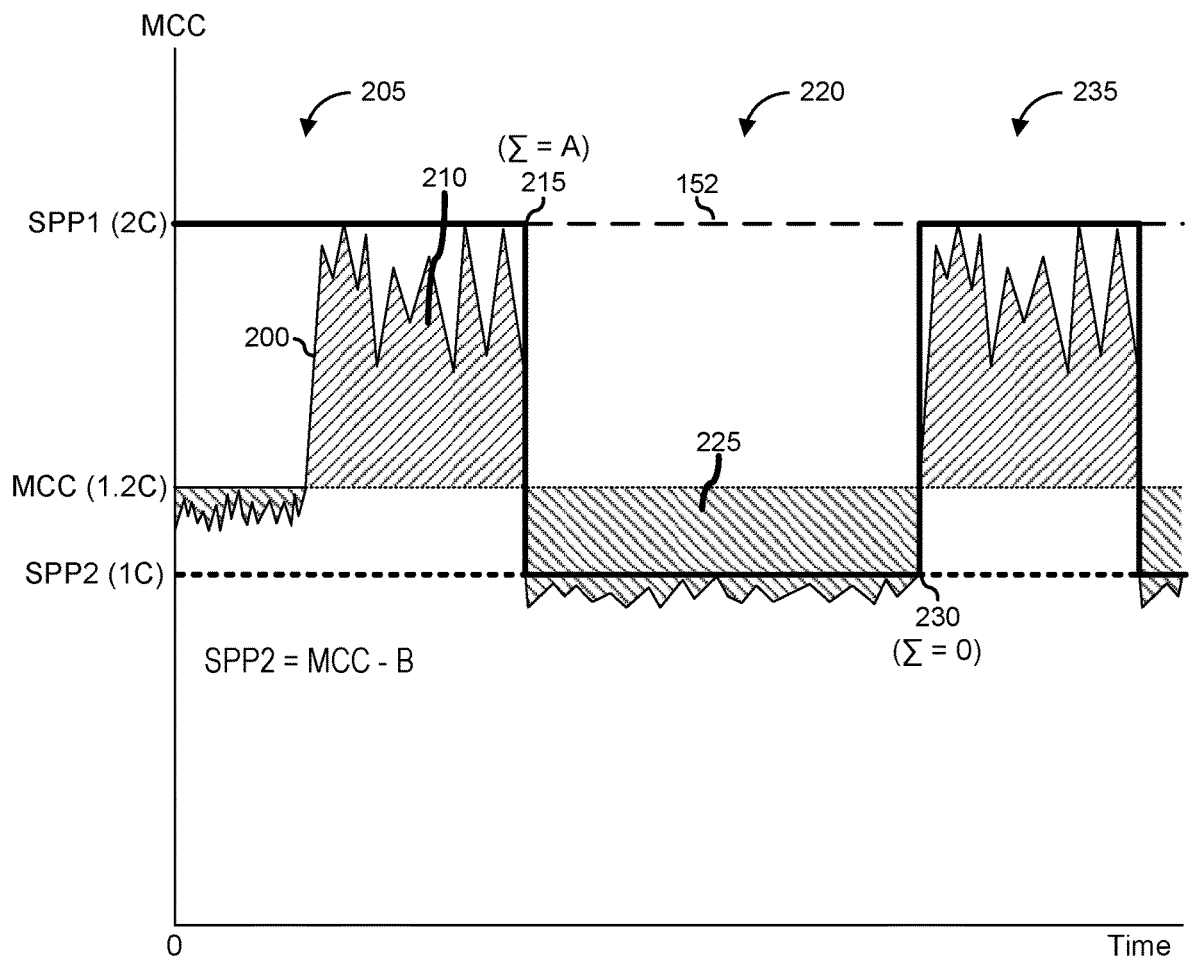
FIG. 2 is a performance chart illustrating enhanced performance operations of the information handling system of FIG. 1.

FIG. 2 illustrates a portion of high-performance window 152 of enhanced performance guidance 150. Here, high-performance window 152 may be understood to have begun at a time zero (0), or may have begun at a time prior to the time zero (0). The indicated SPP value (SPP1) provided by BMU 116 is illustrated as a dark solid line. During a first duration 205, the indicated SPP value provided by BMU 116 and is set at 2 C in accordance with enhanced performance guidance 150. As noted above, the indicated MCC value of 2 C will be understood to be a higher current value than the optimum MCC value that is determined by BMU 116 to provide maximized battery life, battery longevity, and performance level (e.g., 1.2 C, as indicated by the dotted line). As such, it will be understood that currents in excess of the optimum MCC value (1.2 C) will result in unwanted lessening of the battery life increasing battery stress.

In a particular embodiment, BMU 116 operates to measure the actual current provided by battery pack 110 to load 120, to determine if the actual current is greater than the optimum MCC value, and, when the actual current is greater than the optimum MCC value, to accumulate the amount of current over the optimum MCC value. Here, BMU 116 determines a number of amp hours of current over the optimum MCC value. For example, if the actual current drawn by load 120 is 1.8 C for 50 milliseconds, BMU 116 can determine that the actual current is 0.6 C over the optimum MCC value, and can accumulate an overcurrent value of 30 C-milliseconds (i.e., 0.6 C*50 milliseconds). In the illustrated example, the accumulated overcurrent value is seen as the cross-hatched area 210. BMU 116 further operates to set an accumulated overcurrent threshold (A). When the accumulated overcurrent value equals or exceeds the accumulated overcurrent threshold (A), BMU 116 operates to provide a lower indicated SPP value (SPP2). Here, BMU 116 determines that the accumulated overcurrent value equal or exceeds the accumulated overcurrent threshold (A) at a time 215, and battery pack 110 enters a recovery period for a second duration 220. The lower indicated SPP value (SPP2) is below the optimum MCC value, in order to provide a time for the battery to adequately recover from the overcurrent conditions in first duration 205.

Here, BMU 116 is illustrated as providing a lower indicated SPP value of:

SPP2=MCC−*B*, where B is an offset from the optimum MCC value. As illustrated, the SPP2 value is shown at 1 C. When the indicated SPP value is at the SPP2 value, BMU 116 operates to subtract the amount of current below the optimum MCC value from the accumulated current. For example, if the actual current drawn by load 120 is 0.6 C for 50 milliseconds, BMU 116 can determine that the actual current is 0.6 C under the optimum MCC value, and can subtract an undercurrent value of 30 C-milliseconds (i.e., 0.6 C*50 milliseconds). In the illustrated example, the accumulated undercurrent value is seen as the cross-hatched area 225. When the accumulated overcurrent value drops below zero (0) at a time 230, BMU 116 operates to restore the high-performance window indicated SPP value to the SPP1 level (2 C,) entering a third duration 235 at the higher performance level. In another embodiment, rather than subtracting the amount of current below the optimum MCC value from the accumulated current, BMU 116 operates to maintain the indicated SPP value at the SPP2 value (MCC−B) for a predetermined duration, said duration being sufficient to ensure that battery pack 110 has had sufficient rest zero out the accumulated overcurrent. The method described above, of accumulating the amount of overcurrent and reducing the SPP value to a value below the MCC value to reduce the stress on battery pack 110 and on battery cell 112, may be performed during any portion of an enhanced-performance window, as needed or desired. Moreover, the method described above is not limited to only enhanced-performance windows, but may be applied similarly to the peak-performance windows, as well. Here, when the MPP indication is provided (e.g., at the 4 C level), BMU may operate to accumulate the amount of overcurrent, and, upon reaching a threshold (A), may operate to lower the MPP indication to a value below the MCC value (e.g., to a value of MPP−MCC−B), as needed or desired.

Figure 3:
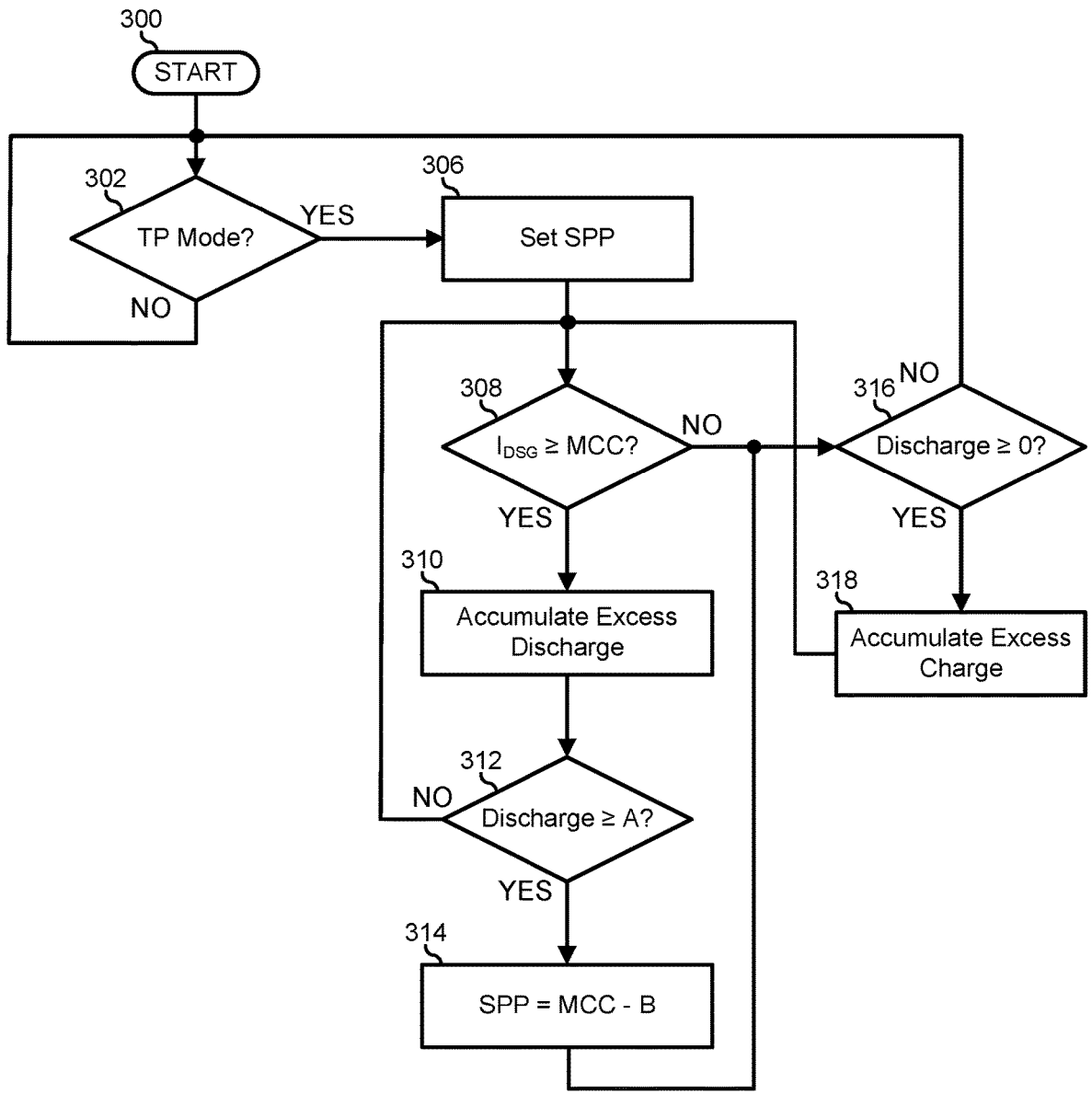
FIG. 3 is a flow chart illustrating a method for intelligent battery power discharge management according to an embodiment of the current disclosure.

FIG. 3 illustrates a method for intelligent battery power discharge management, starting at block 300. A decision is made as to whether or not an information handling system is in a Turbo Power mode in decision block 302. If not, the "NO" branch of decision block 302 is taken and the method loops back to decision block 302 until the information handling system is in the turbo power mode. When the information handling system is in the Turbo Power mode, the "YES" branch of decision block 302 is taken, the indicated SPP value is set to the Turbo Power value (SPP1) (e.g., 2 C) in block 306, and the method proceeds to decision block 308.

After the indicated SPP value is set to the Turbo Power value (SPP1) in block 306, a decision is made as to whether or not the actual discharge current ($I_{DSG}$) is greater than the MCC value in decision block 308. If so, the information handling system will be understood to be in the Turbo Power mode, the "YES" branch of decision block 308 is taken, and the amount of excess discharge on the battery pack is accumulated in block 310. A decision is made as to whether or not the excess discharge on the battery pack is greater than a discharge threshold (A) in decision block 312. If not, the "NO" branch of decision block 312 is taken and the method returns to decision block 308 where the decision is made as to whether or not the actual discharge current ($I_{DSG}$) is greater than the MCC value.

If the excess discharge on the battery pack is greater than the discharge threshold (A), the "YES" branch of decision block 312 is taken, and the indicated SPP value is set to a value below the optimum MCC value (e.g., SPP=MCC−B) in block 314 and the method proceeds to decision block 316, as described below. Returning to decision block 308, if the actual discharge current ($I_{DSG}$) is not greater than the optimum MCC value ($MCC_O$), the "NO" branch of decision block 308 is taken, and the method proceeds to decision block 316.

After the indicated SPP value is set to a value below the optimum MCC value (e.g., SPP=$MCC_O$−B) in block 314, or when the actual discharge current ($I_{DSG}$) is not greater than the optimum MCC value ($MCC_O$) and the "NO" branch of decision block 308 is taken, a decision is made as to whether or not the excess discharge on the battery pack is greater than or equal to zero (0) in decision block 316. If so, the amount of excess charge on the battery pack is accumulated in block 318 and the method returns to decision block 308 where the decision is made as to whether or not the actual discharge current ($I_{DSG}$) is greater than the optimum MCC value ($MCC_O$). If the excess discharge on the battery pack is not greater than or equal to zero (0), the "NO" branch of decision block 316 is taken and the method returns to decision block 302 where a decision is made as to whether or not the information handling system is in a Turbo Power mode. It will be understood that the method as described in FIG. 3 may be similarly applied to the peak-performance window, as described above.

Figure 4:
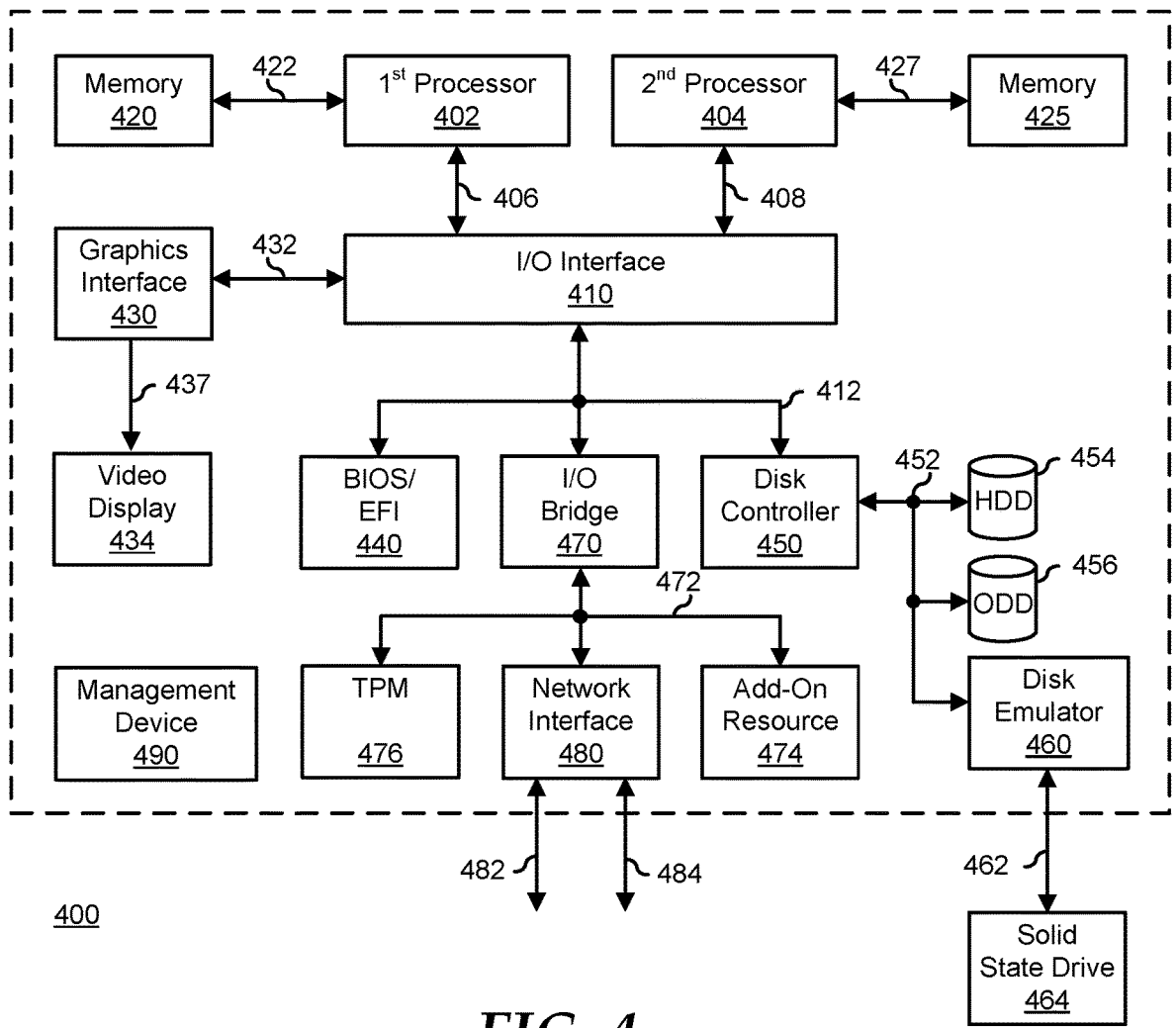
FIG. 4 is a block diagram illustrating a generalized information handling system according to another embodiment of the current disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A battery pack for an information handling system, the battery pack comprising:
    a baseboard management unit;
    a battery cell configured to provide a current output to provide current to a load of the information handling system; and
    a battery management unit including a power reporting output to the baseboard management unit, the power reporting output configured to provide a maximum continuous current (MCC) indication and at least one peak power (PP) indication, the battery management unit configured to determine an amount of current that the battery cell provides to the information handling system on the current output, to determine an optimum MCC value that the battery cell can provide to the information handling system, and to provide the optimum MCC value for the MCC indication on the power reporting output, wherein the MCC value indicates a safe operating current level for the battery cell, wherein the battery management unit:
        provides a first value for the PP indication on the power reporting output, the first value being greater than the optimum MCC value;
        sums the amount of current provided to the information handling system that is in excess of the optimum MCC value;
        determines that the sum is greater than a threshold; and
        provides a second value for the PP indication on the power reporting output,
            the second value being less than the optimum MCC value, wherein the second value is provided to maintain an average current level that is at or below the safe operating current level;
    wherein the baseboard management unit receives the MCC indication and the PP indication from the power reporting output and configures the load based upon the MCC indication and the PP indication.

2. The battery pack of claim 1, wherein, in response to providing the second value, the battery management unit further:
    subtracts the amount of current provided to the information handling system that is less than the optimum MCC value from the sum.

3. The battery pack of claim 2, wherein, in response to the subtracting, the battery management unit further:
    determines that the sum is less than or equal to zero; and
    provides the first value on the PP indication in response to determining that the sum is less than or equal to zero.

4. The battery pack of claim 1, wherein, in response to providing the second value, the battery management unit further:
    maintains the PP indication at the second value for a predetermined duration; and
    after the predetermined duration, provides the second value on the PP indication.

5. The battery pack of claim 1, wherein:
the battery management unit further receives an indication from the information handling system to enter a high current mode; and
providing the PP indication at the first value is in response to receiving the indication from the information handling system.

6. The battery pack of claim 1, wherein the battery management unit determines the optimum MCC value based upon a voltage of the battery cell.

7. The battery pack of claim 6, wherein the battery management unit further determines the optimum MCC value based upon a temperature of the battery pack.

8. The battery pack of claim 1, wherein the battery cell is a lithium-ion battery cell.

9. The battery pack of claim 1, wherein the optimum MCC value is a 1.2 C rating of a battery rating of the battery cell.

10. The battery pack of claim 9, wherein the first value is 2.0 C and the second value is 1.0 C.

11. A method, comprising:
providing, in a battery pack for an information handling system, a battery cell configured to provide a current output to provide a current to a load of the information handling system, and a battery management unit including a power reporting output configured to provide a maximum continuous current (MCC) indication and at least one peak power (PP) indication to a baseboard management unit of the information handling system, the battery management unit configured to determine an amount of current that the battery cell provides to the information handling system on the current output, to determine an optimum MCC value that the battery cell can provide to the information handling system, and to provide the optimum MCC value for the MCC indication on the power reporting output, wherein the MCC value indicates a safe operating current level for the battery cell;
providing, by the battery management unit, a first value for the PP indication on the power reporting output, the first value being greater than the optimum MCC value;
summing the amount of current provided to the information handling system that is in excess of the optimum MCC value;
determining that the sum is greater than a threshold;
providing a second value for the PP indication on the power reporting output, the second value being less than the optimum MCC value, wherein the second value is provided to maintain an average current level that is at or below the safe operating current level; and
configuring, by the baseboard management unit, the load based upon the MCC indication and the PP indication.

12. The method of claim 11, wherein, in response to providing the second value, the method further comprises:
subtracting the amount of current provided to the information handling system that is less than the optimum MCC value from the sum.

13. The method of claim 12, wherein, in response to the subtracting, the method further comprises:
determining that the sum is less than or equal to zero; and
providing the second value on the PP indication in response to determining that the sum is less than or equal to zero.

14. The method of claim 11, wherein, in response to providing the second value, the method further comprises:
maintaining the PP indication at the second value for a predetermined duration; and
after the predetermined duration, providing the second value on the PP indication.

15. The method of claim 11, further comprising:
receiving, by the battery management unit, an indication from the information handling system to enter a high current mode, wherein providing the first value on the PP indication is in response to receiving the indication from the information handling system.

16. The method of claim 11, wherein the battery management unit determines the optimum MCC value based upon a voltage of the battery cell.

17. The method of claim 16, wherein the battery management unit further determines the optimum MCC value based upon a temperature of the battery pack.

18. The method of claim 11, wherein the battery cell is a lithium-ion battery cell.

19. The method of claim 11, wherein the optimum MCC value is a 1.2 C rating of a battery rating of the battery cell, the first MCC value is 2.0 C, and the second MCC value is 1.0 C.

20. An information handling system, comprising:
a baseboard management unit; and
a battery pack including a battery cell including a current output configured to provide current to a load, and a battery management unit including a power reporting output to the information handling system, the power reporting output configured to provide a maximum continuous current (MCC) indication and at least one peak power (PP) indication, the battery management unit configured to determine an amount of current that the battery cell provides to the information handling system on the current output and to determine an optimum MCC value that the battery cell can provide to the information handling system, wherein:
during a relaxed performance time window, the battery management unit provides the MCC value for the MCC indication on the power reporting output;
during a high performance time window, the battery management unit:
provides a first value for the PP indication on the power reporting output, the first value being greater than the optimum MCC value;
sums the amount of current provided to the information handling system that is in excess of the optimum MCC value;
determines that the sum is greater than a threshold; and
provides a second value for the PP indication on the power reporting output, the second value being less than the optimum MCC value; and
wherein the baseboard management unit receives the MCC indication and the PP indication and configures the load based upon the MCC indication and the PP indication.

* * * * *